United States Patent [19]

Dervisoglu

[11] Patent Number: 5,257,223
[45] Date of Patent: Oct. 26, 1993

[54] FLIP-FLOP CIRCUIT WITH CONTROLLABLE COPYING BETWEEN SLAVE AND SCAN LATCHES

[75] Inventor: Bulent I. Dervisoglu, Framingham, Mass.

[73] Assignee: Hewlett-Packard Company, Palo Alto, Calif.

[21] Appl. No.: 791,868

[22] Filed: Nov. 13, 1991

[51] Int. Cl.[5] .................. G11C 19/00; H03K 3/289
[52] U.S. Cl. .................. 365/154; 365/189.05; 365/189.012; 307/272.2; 377/70
[58] Field of Search .......... 365/154, 189.05, 189.12; 307/272.1, 272.2, 244, 247.1, 279, 291; 377/70

[56] References Cited

U.S. PATENT DOCUMENTS

| | | | |
|---|---|---|---|
| 4,495,629 | 1/1985 | Zasio et al. | 377/70 |
| 4,540,903 | 9/1985 | Cooke et al. | 307/272.2 |
| 4,975,595 | 12/1990 | Roberts et al. | 307/272.2 |
| 5,068,881 | 11/1991 | Dervisoglu et al. | 377/70 |
| 5,130,568 | 7/1992 | Miller et al. | 307/272.2 |

FOREIGN PATENT DOCUMENTS 2-117205  5/1990  Japan .................. 307/272.2
2-134916  5/1990  Japan .................. 307/272.2

OTHER PUBLICATIONS

Yashwant K. Malaiya and Ramesh Narayanaswamy, "Testing for Timing Faults in Syncronous Sequential Integrated Circuits," *IEEE 1983 International Test Conference*, Paper 19.3, pp. 560–571.

Primary Examiner—Eugene R. LaRoche
Assistant Examiner—Tan Nguyen
Attorney, Agent, or Firm—Richard F. Schuette

[57] ABSTRACT

A scannable flip-flop circuit allows data at its data input or its scan input to be stored in the flip-flop at its data output or shifted out of the flip-flop at its scan output. The flip-flop provides control circuitry for selecting the source of the input data and scan data. Data stored at the flip-flop data output may also be shifted out at the scan output. During scan operations, additional control circuitry allows data stored at the data outputs to be preserved.

19 Claims, 8 Drawing Sheets

FLIP-FLOP CIRCUIT WITH CONTROLLABLE COPYING BETWEEN SLAVE AND SCAN LATCHES

BACKGROUND OF THE INVENTION

Large digital systems are essentially composed of memory elements called "latches" or "flip-flops", combinational logic, and a clocking system. The memory elements are arranged in sets sometimes called registers. The number of elements in a set is usually the number of bits per word in the system. Between the sets of memory elements are combinational logic circuits. Each of these circuits performs logic operations on the outputs of a register and outputs the results of the operations to the inputs of another register.

At the end of a clock cycle, which is also the beginning of the next clock cycle, the data on the outputs of one combinational logic circuit is stored in a register. The data appears on the outputs of the register and, therefore, on the inputs of the next combinational logic circuit. This second combinational logic circuit performs the desired logic functions and applies the resultant data to the inputs of the next register. At the end of the next clock cycle, the data is stored in this second register. This process in repeated as the system operates, that is, data is processed by combinational logic circuits, stored, passed on to the next combinational logic circuit, processed, stored, and so on.

One common type of flip-flop is the master-slave flip-flop. The master-slave flip-flop is composed of two latch stages, namely, a master latch stage and a slave latch stage. The flip-flop inputs are coupled to the master latch inputs, and the master latch outputs are coupled to the slave latch inputs. The slave latch outputs are the outputs of the master-slave flip-flop. The coupling in the flip-flop is controlled by a clock signal. When the clock signal is active, the flip-flop input is connected to the master latch input and, therefore, the output of the master latch follows the input to the flip-flop. At the same time, the clock signal isolates the master latch output from the slave latch input. As a result, the flip-flop output is prevented from following every transition on the flip-flop input. When the clock signal changes to its inactive state, the master latch input is disconnected and its output is connected to the slave latch to become the master-slave flip-flop output.

A feature commonly used in digital systems is the "scannable latch" or "scannable flip-flop". A scannable flip-flop includes a latch which can be converted to a stage of a shift register by the use of appropriate clock signals. Whereas a register coupled between combinational logic circuits typically receives and outputs bits of a word in parallel, the shift register receives the bits at one end and shifts them through its stages serially to an opposite end. The scannable flip-flop allows the contents of the shift register to be "scanned" by shifting out the contents for examination. Following this "scan out" operation, the data formerly stored in the flip-flop can be restored to the flip-flop by shifting the data back in. Also, the flip-flop can be loaded with new contents by shifting in new data. Such operations are typically performed during testing and diagnostic procedures.

The ability to shift data in and out of registers is a powerful diagnostic tool. For example, if an error is detected during some complicated series of operations, the system can be stopped, and the contents of the registers involved can be shifted out. If further testing is required to isolate the cause of the error, a set of known data can be shifted into the registers. The system can then be allowed to carry out the series of operations one step at a time. After each step, the contents of the registers can be shifted out and compared to expected data. If there is no error, the data is shifted back into the registers, and the next step is executed. This process is continued until an error is detected. In this way, the register in which the error occurred is readily isolated so that the cause of the error can more easily be determined.

SUMMARY OF THE INVENTION

The present invention is a scannable flip-flop comprising a master latch, a slave latch, and a scan latch. The master and slave latches function as the data storage section of the scannable flip-flop, and the master and scan latches function as the shift register section. The output of the slave latch is used as the Q or data output of the flip-flop. As such, it represents the data contents of the flip-flop. The output of the scan latch is used as the scan output of the flip-flop. The slave latch and scan latch are coupled together such that a value stored in one can be copied into the other.

The preferred embodiment of the invention includes a circuit which allows the coupling between the slave latch and the scan latch to be controlled. The two latches may be either connected together or isolated from each other. When they are connected together, data stored in the slave latch is copied into the scan latch, and data stored in the scan latch is copied into the slave latch. When they are isolated from each other, data stored in the slave latch is not copied into the scan latch, and data shifted into the scan latch has no effect on the slave latch.

The controllable coupling between the slave and the scan latches provides the present invention with several advantages. With the slave and scan latches connected, the scan latch always contains the present contents (directly or inversely) of the slave latch of the flip-flop. Therefore, no special clock signals are required to load the contents of the slave latch into the scan latch before the contents can be shifted out. Also, the scanning capability of the flip-flop does not degrade system performance- during normal operation. Since the scan output is driven by a separate scan latch, the slave latch, and thus the data output, is not loaded down by any circuitry connected to the scan output.

With the slave latch and scan latch isolated from each other, the scan operation has no effect on the contents of the slave latch. Therefore, while scanning data into a register made from these scannable flip-flops, the flip-flop outputs do not change. This prevents any undesirable logic state switching from propagating through the system. Also, scanning data out of a register does not disturb the contents of the register. Therefore, while performing the step-by-step diagnostic testing procedure described above, it is not necessary to restore the data to the register after it is scanned out and examined for errors. The process may continue directly to the next step.

In addition, the data inputs to the flip-flops in the register may also be scanned out. After the system is stopped, the outputs of each combinational logic circuit are applied to the inputs of the next register. These inputs may be shifted into the scan latches of the flip-flop and then shifted out for examination. Since the scan latches and slave latches are isolated from each other, this operation does not alter the contents of the register. Therefore, the contents of the register can also still be scanned.

Isolating the slave latch and scan latch also prevents the scan latch from following the slave latch. If no output data is required from the scan latch during normal system operation, the two latches can be isolated. This will reduce the number of logic state changes and, therefore, the power consumption of the system.

DETAILED DESCRIPTION OF THE INVENTION

Figure 1A:
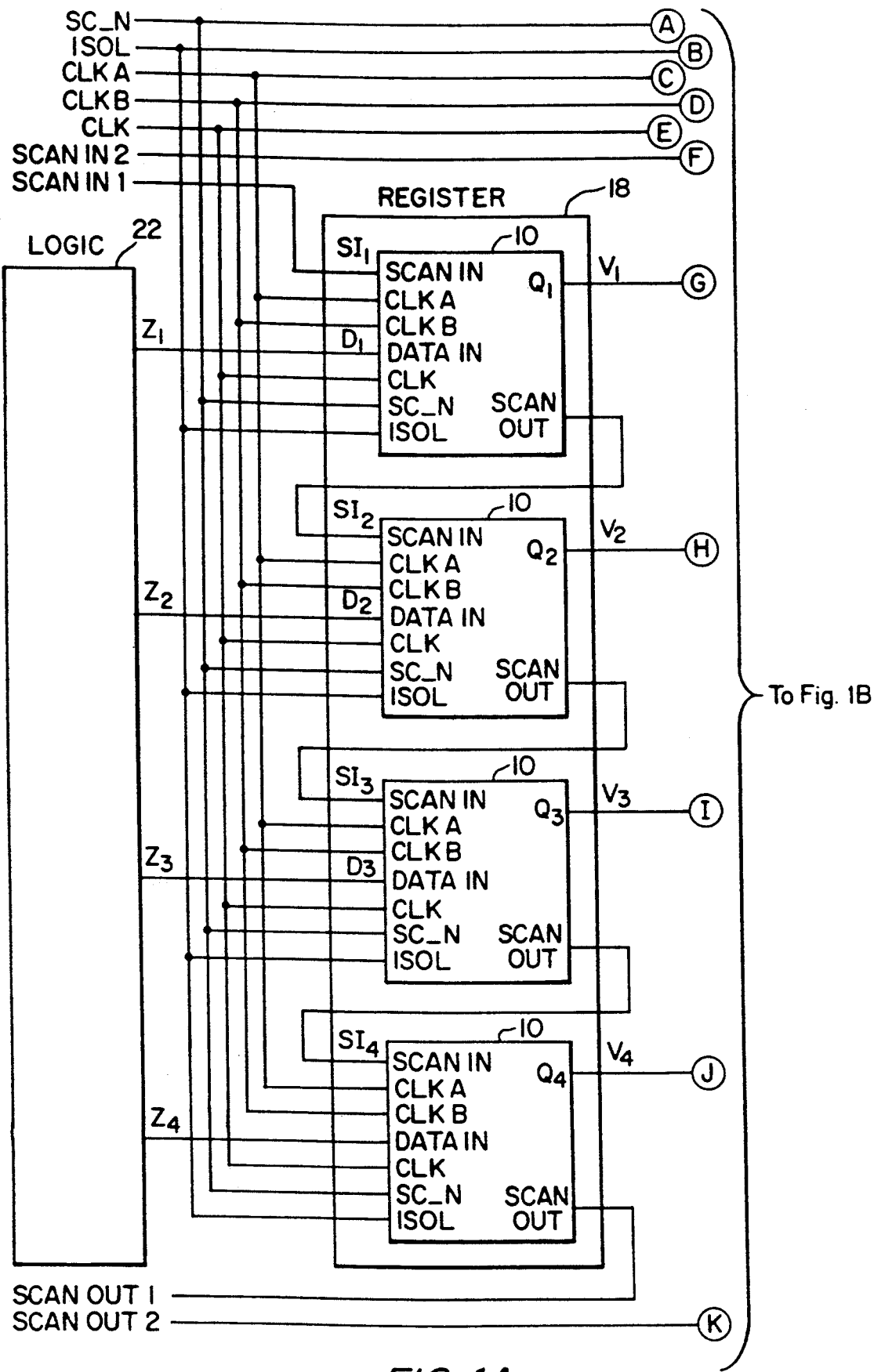
FIGS. 1a and 1b are a block diagram of a portion of a digital system comprising the present invention.
Figure 1B:
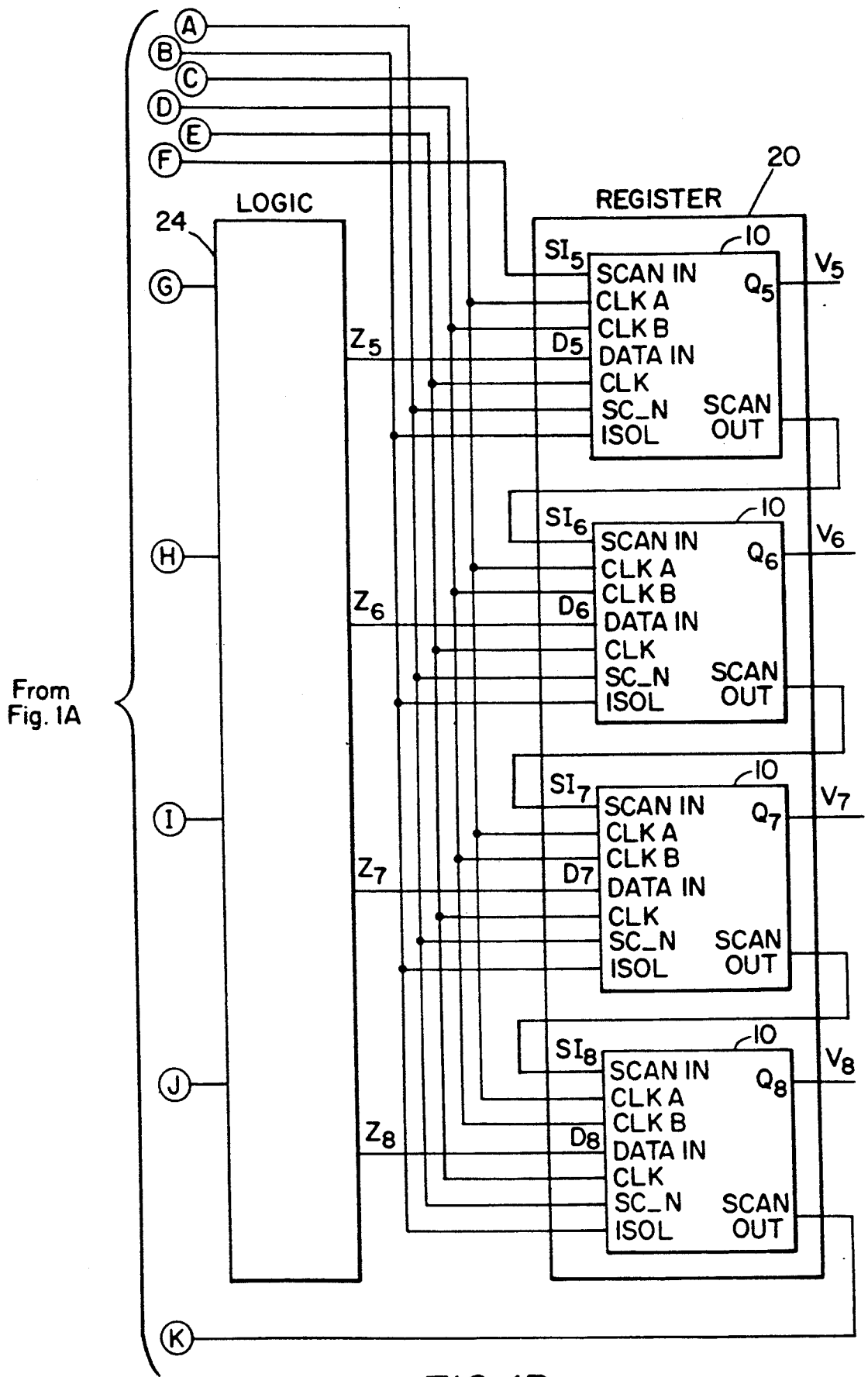

FIG. 1 depicts a portion of a digital system comprising the present invention. Scannable flip-flops 10 are grouped together in registers 18 and 20. Parallel data from combinational logic circuits 22 and 24 is applied to the flip-flop data inputs $D_1$–$D_4$ of register 18 and $D_5$–$D_8$ of register 20, respectively. Parallel data appears at the data outputs $Q_1$–$Q_4$ of register 18 and $Q_5$–$Q_8$ of register 20.

Registers 18 and 20 can also process serial data. The scan output SO of each flip-flop is connected to the scan input SI of the next flip-flop. Data applied to the scan input of each register 18 and 20 can be serially shifted into the register. Also, data in the register can be serially shifted out of the register at the scan output.

Figure 2:
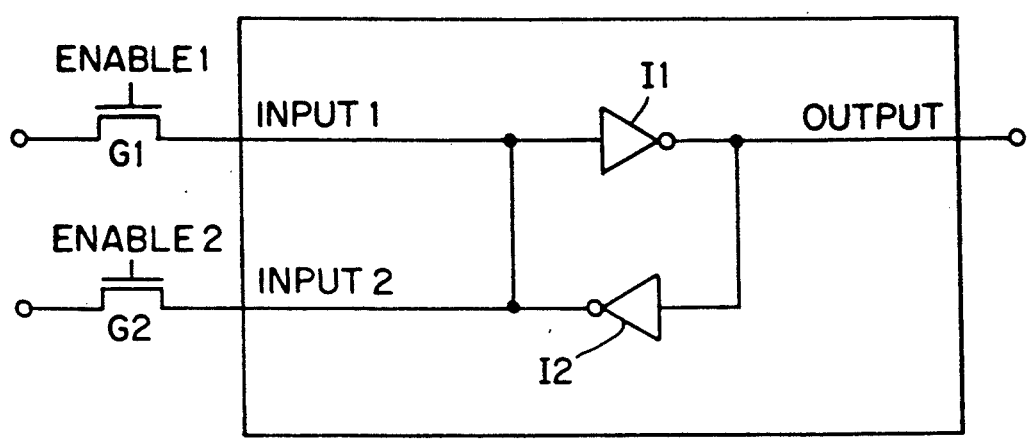
FIG. 2 is a logic diagram of a typical latch circuit used to implement the present invention.

FIG. 2 depicts the function of a typical latch circuit used in the embodiments of the invention. Data is applied to INPUT1 when ENABLE1 is asserted. The data is inverted by inverter I1 and appears as the output of the latch. The data is inverted again by inventer I2 and applied back to the input of I1. When ENABLE1 changes states to inactive, the data is stored in the latch and maintained in its latched state by inverter I2. INPUT2 functions in the same manner with signal ENABLE2 controlling the latch.

Figure 3:
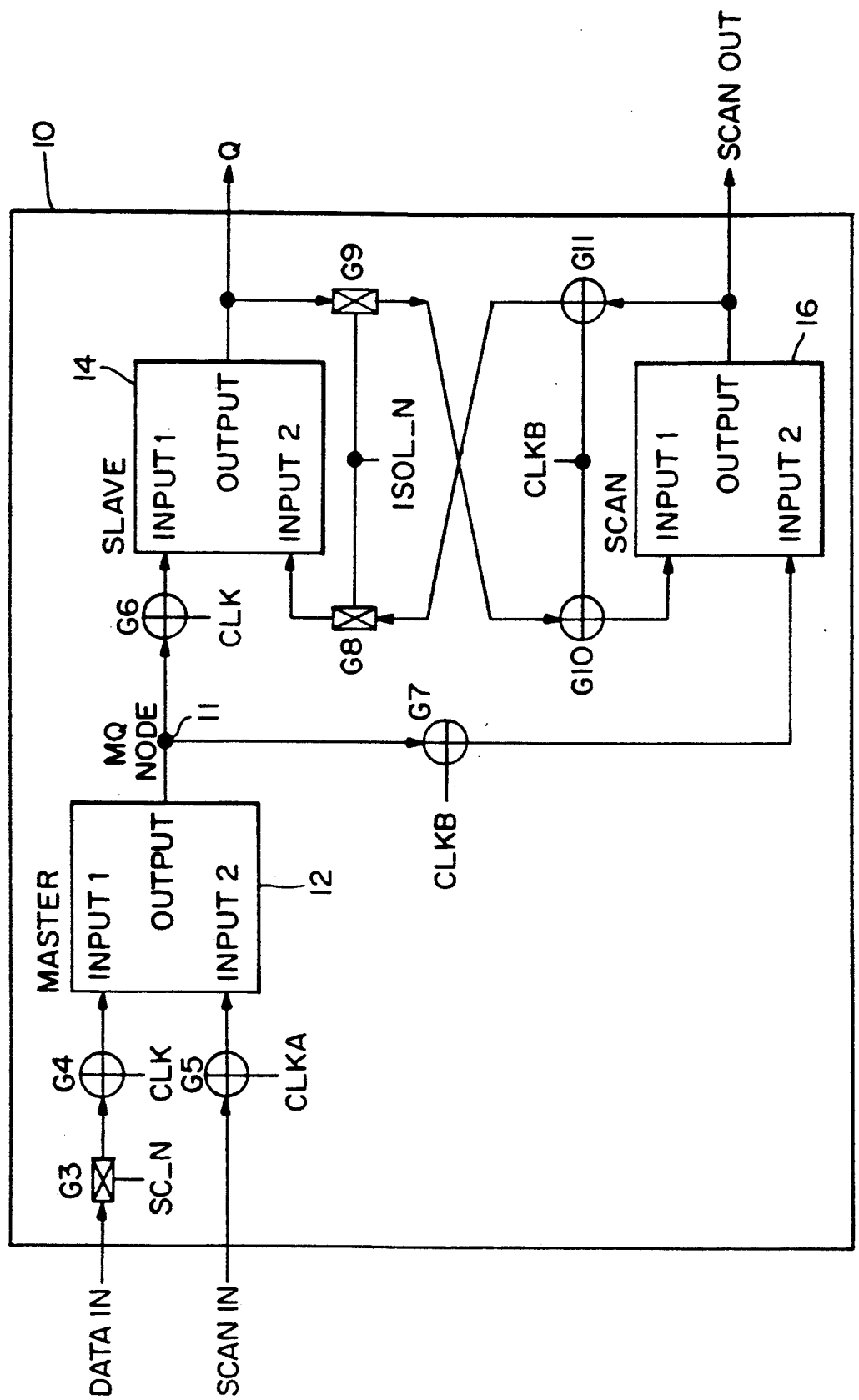
FIG. 3 is a block diagram of a scannable flip-flop in accordance with the present invention.

FIG. 3 is a block diagram of the scannable flip-flop circuit. Data at the DATA IN input is enabled to INPUT1 of master latch 12 through transmission gate G3 when control signal $SC_{13}N$ is asserted and through G4 when the system clock signal CLK is deasserted. The data appears at the output of master latch 12 at MQ node 11. When CLK is asserted, the data is latched into master latch 12 and is applied through G6 to INPUT1 of slave latch 14 and appears at the output of slave latch 14 and, therefore, at the Q output of the flip-flop. If control signals ISOL_N and CLKB are asserted, G9 and G10 are enabled, and the data in slave latch 14 is copied into scan latch 16. When CLK is deasserted, G6 is disabled, and the data is latched in the slave latch 14 and scan latch 16.

Data at the SCAN IN input is enabled through G5 to INPUT2 of master latch 12 and then latched into master latch 12 by successive state transitions of scan clock signal CLKA provided SC_N is deasserted. When CLKB is asserted, data latched in master latch 12 is enabled through G7 to INPUT2 of scan latch 16 and appears at the SCAN OUT flip-flop output. The CLKB signal also enables G11; therefore, if ISOL_N is asserted, G8 is enabled, and the data in scan latch 16 is copied into slave latch 14. When CLKB is deasserted, the data is latched into scan latch 16 and slave latch 14.

Figure 4:
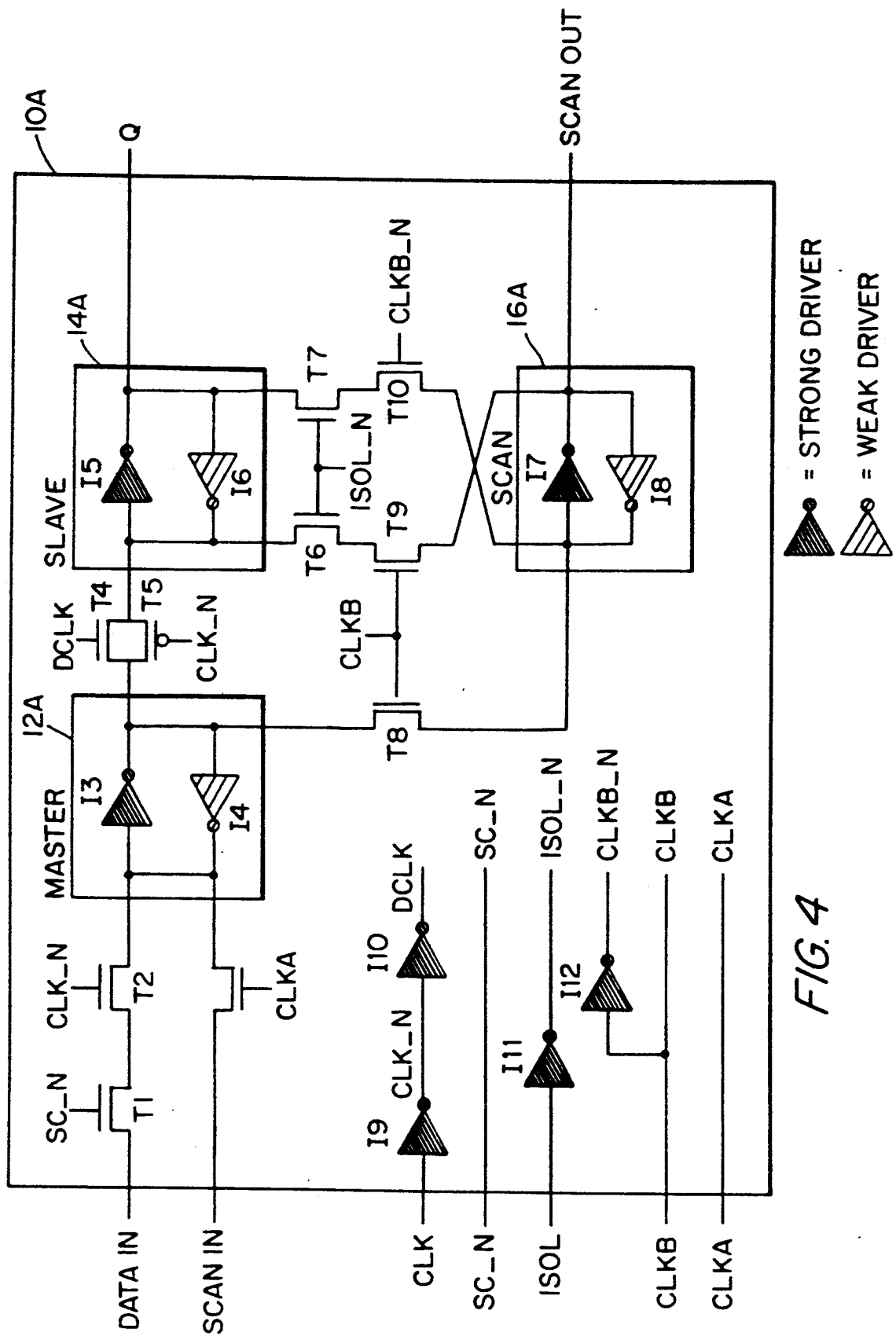
FIG. 4 is a logic diagram of an implementation of the embodiment of FIG. 3.
Figure 5:
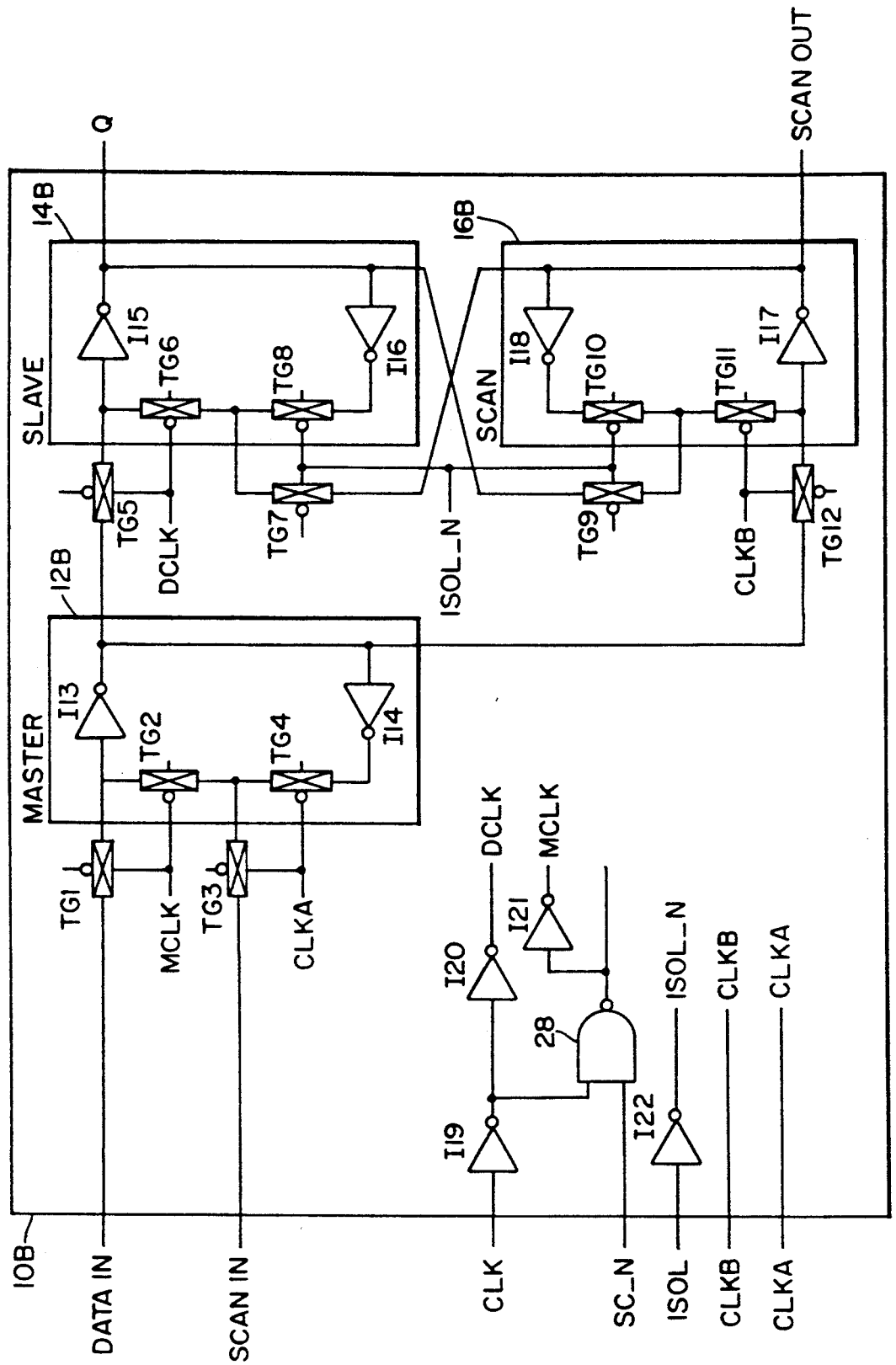
FIG. 5 is a logic diagram of another embodiment of the present invention.

It should be noted that in each of the three latches in the flip-flops of FIG. 4 and FIG. 5, there is one level of logic inversion between the input and the output. Therefore, in the descriptions below, where a value is said to be "copied", "transferred", "clocked", "stored", etc. to a latch, that inversion of logic states is implied. However, the present invention can also be implemented with latches which are not made from inverters and thus do not introduce a level of logic inversion. Flip-flops made from latches without inverters are within the spirit and scope of the invention as defined in the appended claims.

FIG. 4 depicts an implementation of the embodiment of FIG. 3. In this configuration, each of the latch circuits 12A, 14A, and 16A is implemented with a pair of inverters. One of the inverters in each latch (I3, I5, I7) has stronger drive capability than the other (I4, I6, I8). This enables the output of the latch to drive the input of the next latch regardless of the state of the weaker inverter of the next latch. For example, in FIG. 4, if slave latch 14A has a high output value, the input of inverter I6 is high, and its output is low. The output of I6 drives the input of I5, maintaining the high value at the output of I5 and, therefore, at the output of slave latch 14A. If it is desired to change the value in slave latch 14A to low, the output of inverter I3 in master latch 12A will be set high, and the control signal DCLK (derived from CLK through inverters I9 and I10) will be asserted to enable pass transistor T4. CLK_N (derived from CLK through I9) is deasserted, thus enabling pass transistor T5. At the input to inverter I5, contention will exist between outputs of inverter I3 and inverter I6. I3 will try to drive the input high, and I6 will try to drive the input low. But, since I3 has stronger drive capability, it will drive the input to I5 high; the output of I5 will change to low, and the output of I6 will change to high. When T4 and T5 are disabled and I3 is no longer driving the input to I5, the output of I6 will maintain I5 in the desired low state.

In the circuit of FIG. 4, the control signal SC_N is used to select the mode of operation. In normal or system mode operation, SC_N is asserted, and CLKA and CLKB are deasserted. With SC_N asserted, T1 is enabled. When CLK is deasserted, CLK_N is asserted and T2 is enabled. Data appearing at the DATA IN input is applied to master latch 12A. When CLK is asserted, transistor T2 is disabled, and the data is latched in master latch 12A. At the same time, DCLK is asserted and CLK_N is deasserted. T4 and T5 are enabled, and the data in master latch 12A is applied to the input of slave latch 14A and appears on its output and at the Q output of the flip-flop. When CLK is deasserted, T2 is enabled, and T4 and T5 are disabled. The data is latched in slave latch 14A, and new data at the DATA IN input is enabled to master latch 12A.

If the control signal ISOL_N (derived from ISOL through inverter I11) is asserted, transistor T7 is active.

Since scan clock CLKB is deasserted, CLKB_N (derived from CLKB through I12) is asserted, and transistor T10 is also active. Therefore, slave latch 14A and scan latch 16A are not isolated from each other. When data appears at the output of slave latch 14A, it is copied into scan latch 16A. In this way, the three latches act as one flip-flop, with the output of slave latch 14A being the Q output of the flip-flop and the output of scan latch 16A being the −Q output. Another method of obtaining the −Q flip-flop output is simply connecting the Q output to a separate inverter and using the inverter output as −Q. If control signal ISOL_N is deasserted, T6 and T7 are both disabled, and slave latch 14A and scan latch 16A are isolated from each other. Data at the output of slave latch 14A will not appear in scan latch 16A. Therefore, scan latch 16A does not change state to follow slave latch 14A, thus reducing power consumption of the flip-flop.

In the scan mode of operation, SC_N is deasserted. This prevents data appearing on the DATA IN input from being applied to master latch 12A simultaneously with data on the SCAN IN input. When scan clock CLKA is asserted, T3 is enabled, and data at the SCAN IN input will appear at an input of the master latch. When CLKA is deasserted, the data is latched in master latch 12A. If CLKB is then asserted, T8 is enabled, and data in the master latch 12A is copied into scan latch 16A. When CLKB is deasserted, T8 is disabled, and the data is latched in scan latch 16A.

If ISOL_N is asserted during the CLKB pulse, T6 and T9 are active, and the data appearing at the output of scan latch 16A will be copied into slave latch 14A. If ISOL_N is deasserted, T6 is inactive, and the scan data will not appear on slave latch 14A. Thus, data may be shifted through the flip-flop via the SCAN IN input and the SCAN OUT output without changing the value of the Q output.

FIG. 5 depicts another embodiment of the present invention. This flip-flop circuit 10B is implemented with gate array technology in which all like components are the same size and have the same drive capabilities. Therefore, it cannot be assumed that the input signal to a latch will overcome the opposing inverter gate in the latch. To ensure that the input to each latch will be able to change the state of the output inverter (I13, I15, I17) and, therefore, the latch output, transmission gates (TG) are used to isolate the output of the opposing inverter (I14, I16, I18) from the input of the latch. For example, with CLK asserted, the signal MCLK (derived from CLK and SC_N through inverter I19, NAND gate 28 and inverter I21) is deasserted. Gate TG1 is disabled, and gate TG2 is enabled. If CLKA is also deasserted, gate TG3 is disabled, and gate TG4 is enabled. Data at the DATA IN or SCAN IN inputs is blocked from master latch 12B. The value in master latch 12B appears at the output of inverter I13. The value is inverted by I14, and the inverted value is applied to the input of I13 through the enabled gates TG2 and TG4. The value in master latch 12B can be changed by enabling data to its inputs from either the DATA IN input or the SCAN IN input by setting appropriate clock signals. With CLK deasserted and SC_N asserted, MCLK is asserted. TG1 is enabled, and TG2 is disabled, so only data on DATA IN reaches the input to I13 and thus the master latch 12B. If, on the other hand, CLKA is asserted, TG3 is enabled and TG4 is disabled. If SC_N is deasserted, MCLK is deasserted and maintains TG1 disabled and TG2 enabled. Therefore, only data at SCAN IN reaches the input of I13.

In slave latch 14B, data is maintained in I15 by I16 when TG6 and TG8 are enabled. If it is desired to transfer data from master latch 12B to slave latch 14B, DCLK (derived from CLK through inverters I19 and I20) is asserted. TG5 is enabled, and TG6 is disabled, so only data from master latch 12B reaches the input of inverter I15. The data is inverted by I15 and appears at the slave latch output, also the Q output of the flip-flop. If it is desired to transfer data from scan latch 16B to slave latch 14B, ISOL_N (derived from ISOL through inverter I22) is asserted and DCLK is deasserted. TG7 is enabled, TG8 is disabled, and, since DCLK is deasserted, TG6 is enabled; so, data from scan latch 16B is transferred to slave latch 14B.

In scan latch 16B, data is maintained in I17 by I18 when TG10 and TG11 are enabled. If it is desired to transfer data from master latch 12B to scan latch 16B, CLKB is asserted. TG12 is enabled, and TG11 is disabled, so only data from master latch 12B reaches the input of inverter I17. The data is inverted by I17 and appears at the scan latch output, which is also the SCAN OUT output of the flip-flop. If it is desired to transfer data from slave latch 14B to scan latch 16B, ISOL_N is asserted and CLKB is deasserted. TG9 is enabled, TG10 is disabled, and, since CLKB is deasserted, TG11 is enabled: so, data from slave latch 14B is transferred to scan latch 16B.

Functionally, the circuits of FIG. 4 and FIG. 5 are the same, with one minor difference. If the signals DCLK and CLKB are asserted simultaneously, the circuits will behave differently. In FIG. 4, there will be contention between the outputs of I3 and I7 at the input of I5 in the slave latch. Therefore, the output of the slave latch is indeterminate. However, in FIG. 5, because DCLK is asserted, TG5 is enabled, and I13 drives the input of I15 in the slave latch. TG6 is disabled, so no other signal can attempt to drive I15. There is no contention, and I13 controls the output of the slave latch. This difference can be eliminated by selecting I3 in FIG. 4 such that it has higher drive capability than I7. When DCLK and CLKB are asserted simultaneously, I3 will dominate I7 at the input of I5 and will therefore control the output of the slave latch. Thus, the two circuits will behave in the same manner.

FIG. 1 depicts a possible configuration in which the scannable flip-flop can be used. Flip-flops 10 are grouped together in registers 18 and 20. The outputs of combinational logic 22 and 24 are the DATA IN inputs to the flip-flops in registers 18 and 20, respectively. The Q outputs of the flip-flops are connected to the inputs of the combinational logic. To allow data to be shifted through the registers, the SCAN OUT output of each flip-flop is connected to the SCAN IN input of the next flip-flop. The SCAN IN input of the first flip-flop in each register is used as the SCAN IN input for the register, and the SCAN OUT output of the last flip-flop in each register is used as the SCAN OUT output for the register.

In the normal system mode of operation, control signal SC_N is asserted and ISOL is deasserted. Data at the outputs of logic 22 is applied to the DATA IN inputs of register 18. After a CLK pulse in which the CLK signal is asserted and then deasserted, the data is latched into register 18 and appears at its Q outputs and the inputs of logic 24. Logic 24 performs the required logic operations on the input data, and the resultant data appears at the outputs of logic 24 and the DATA IN inputs of register 20. Following the next CLK pulse, this data is latched into register 20 and appears at its Q outputs.

If it is desirable to shift data out of or into registers 18 and 20, flip-flops 10 must be placed in the scan mode of operation. CLK is deasserted, control signal SC_N is deasserted and ISOL is asserted to prevent the scan operation from effecting the Q outputs of the register.

Figure 6:
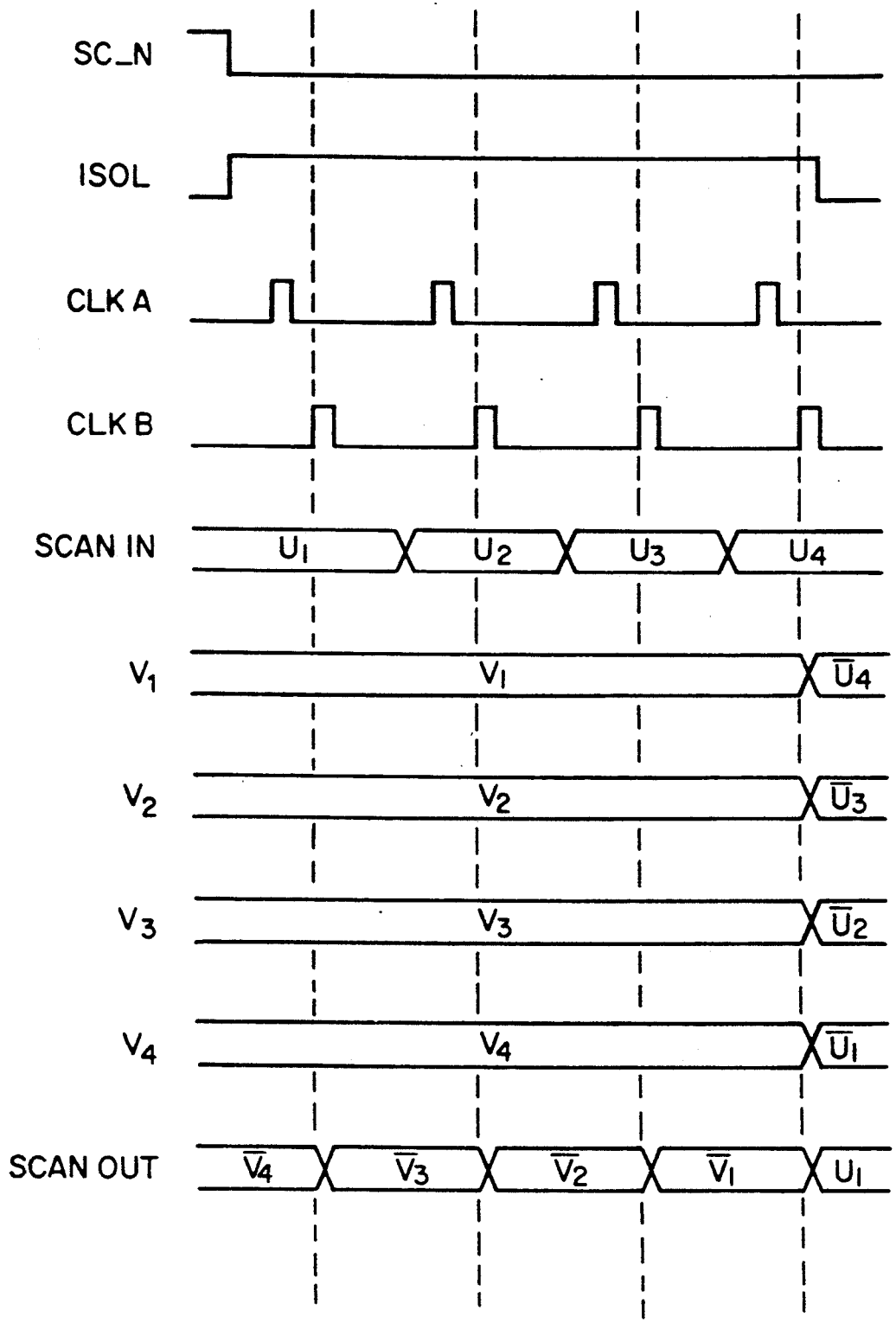
FIG. 6 is a timing diagram for the scan-in and scan-out functions performed by the present invention.

FIG. 6 is a timing diagram for a scan-in and a scan-out operation performed simultaneously on register 18. The SCAN OUT output of each flip-flop stage is shifted to the next flip-flop stage by a CLKA pulse followed by a CLKB pulse. After four pairs of scan clock pulses, the original contents of the register, $V_1$, $V_2$, $V_3$, $V_4$, have been shifted to the SCAN OUT output of register 18. At the same time, new register data, $U_1$, $U_2$, $U_3$, $U_4$, has been shifted into the register. During this operation, the outputs of register 18, $V_1$, $V_2$, $V_3$, $V_4$, did not change because ISOL was asserted. However, ISOL is deasserted after the last CLKB pulse to allow the new data to be copied into the register outputs.

The flip-flop circuit 10 is also capable of shifting the DATA IN flip-flop inputs to the SCAN OUT output. While the system in FIG. 1 is operating in its normal mode, it may become necessary to scan the flip-flop data inputs to examine them for errors. To do this, the system CLK is deasserted. Since SC_N is asserted, the last set of input data is applied to master latch circuits 12. To scan this data out of the register, ISOL is asserted and a CLKB pulse is applied. This latches the data inputs in scan latches 16 and at the SCAN OUT flip-flop outputs. Thus, by applying the CLKB pulse before the CLKA pulse, the values initially held by the master latches 12 are presented in the scan latches 16 for subsequent scan-out. The values can then be scanned out as described above with the CLKA pulse followed by the CLKB pulse. Since ISOL is asserted during the first scan-out, the flip-flop Q outputs are preserved and can be scanned out next. This is done by deasserting and then asserting ISOL to latch the slave outputs into scan latches 16 and then following the scan-out procedure. Since CLKA precedes CLKB, the values initially held in slave latches 14 copy over the values initially in master latches 12, so the latter are lost in this scan operation.

Figure 7:
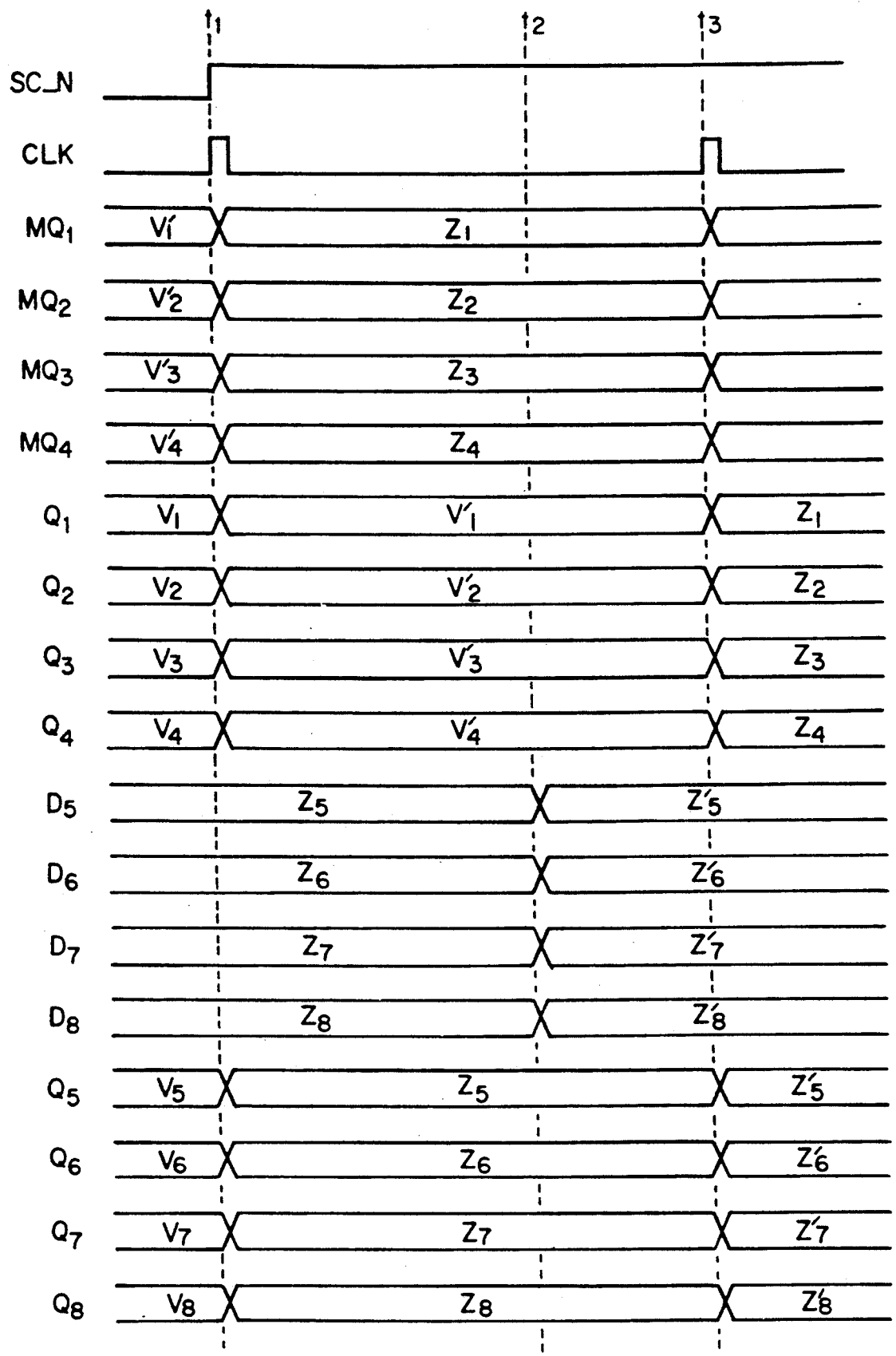
FIG. 7 is a timing diagram for a logic testing function performed by the invention.

The configuration of FIG. 1 can also be used to test combinational logic 22 and 24. For example, registers 18 and 20 can be used to measure the propagation delays in logic 24. FIG. 7 is a timing diagram for the measurement. To perform the measurement, CLK, SC_N, and ISOL are deasserted. A set of known data, $V_1$, $V_2$, $V_3$, $V_4$, is scanned into register 18. Since ISOL is deasserted, the data is latched in slave latches 14 and appears at the Q outputs of flip-flops 10. With $V_1$-$V_4$ applied to the inputs of logic 24, the resulting outputs $Z_5$-$Z_8$ are applied t IN inputs of register 20. Next, a second set of known data, $V_1'$, $V_2'$, $V_3'$, $V_4'$, is scanned in with ISOL asserted. This second set of data is latched in master latches 12 and appears at nodes $MQ_1$-$MQ_4$ of flip-flops 10. Then, at time $t_1$, a CLK pulse is applied followed by assertion of SC_N. Data $Z_5$-$Z_8$ is clocked to the outputs $Q_5$-$Q_8$ of register 20. At the same time, $V_1'$-$V_4'$ appear at the outputs $Q_1$-$Q_4$ of register 18 and at the inputs of logic 24. This data propagates through logic 24, and some time later, at time $t_2$, the outputs of logic 24 change to $Z_5'$-$Z_8'$. A second CLK pulse is then applied at time $t_3$, and the new register 20 DATA IN inputs, $Z_5'$-$Z_8'$, are clocked to the register 20 outputs $Q_5$-$Q_8$. If this second clock pulse (time $t_3$) comes after $Z_5'$-$Z_8'$ appear at the logic 24 outputs (time $t_2$), then the register 20 outputs will contain $Z_5'$-$Z_8'$ after time $t_3$. However, if the logic 24 outputs have not changed before $t_3$, the new data will not appear at the register 20 outputs. Therefore, an accurate measurement of the delays in logic 24 can be obtained by repeatedly performing the procedure described above, each time reducing the separation in time between the two clock pulses. That is, each time the process is repeated, the time between CLK pulses, $t_3$-$t_1$, is reduced. Eventually, this time will approach the time delay, $t_2$-$t_1$, in the logic. When the outputs of register 20 do not capture the change in data from $Z_5$-$Z_8$ to $Z_5'$-$Z_8'$, the time $t_3$-$t_1$, is equal to or less than the delay in logic 24, $t_2$-$t_1$. Thus, an accurate measurement of the delay is obtained.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A scannable flip-flop circuit comprising:
   a master latch circuit responsive to a system clock to latch a first input and responsive to a first scan clock to latch a second input;
   a slave latch circuit responsive to the system clock to latch a value from the master latch;
   a scan latch circuit responsive to a second scan clock to latch a value from the master latch; and
   a copying circuit by which one of the slave latch and scan latch receives and latches a value from the other.

2. A scannable flip-flop circuit as defined in claim 1 wherein the copying circuit is controllable such that neither of the slave latch and the scan latch receives and latches a value from the other.

3. A scannable flip-flop circuit as defined in claim 1 in which the scan latch receives and latches a value from the slave latch.

4. A scannable flip-flop circuit as defined in claim 1 in which the slave latch receives and latches a value from the scan latch.

5. A scannable flip-flop circuit as defined in claim 4 in which the scan latch receives and latches a value from the slave latch.

6. A scannable flip-flop circuit as defined in claim 1 in which the master, slave, and scan latch circuits are each implemented with two inverter gates, the output of the first inverter gate being coupled to the input of the second inverter gate and the output of the second inverter gate being coupled to the input of the first inverter gate.

7. A scannable flip-flop circuit as defined in claim 6 in which the first inverter gate has greater drive capability than the second inverter gate, such that contention at the input of a latch stage between its second inverter gate and the first inverter gate of the previous latch stage is eliminated, the value stored in the latch being controlled by the dominant first inverter gate of the previous latch stage.

8. A scannable flip-flop circuit comprising:
   a data input at which the flip-flop circuit receives input data;
   a scan input at which the flip-flop circuit receives scan data;
   a data output for holding flip-flop data;

a scan output for holding flip-flop data; and a controllable coupling circuit between the data output and the scan output, said coupling circuit being controllable by a control signal, said control signal being switchable between two states, in the first state of the control signal, the coupling circuit coupling the data output to the scan output and in the second state of the control signal, the coupling circuit isolating the data output from the scan output.

9. A scannable flip-flop circuit as defined in claim 8 wherein, during normal operation, in the first state of the control signal, input data at the data input is copied to both the data output and the scan output, and, in the second state of the control signal, input data at the data input is copied to only the data output, thus preserving the flip-flop data at the scan output.

10. A scannable flip-flop circuit as defined in claim 8 wherein during a scan operation, in the first state of the control signal, scan data at the scan input is copied to both the scan output and the data output, and, in the second state of the control signal, scan data at the scan input is copied to only the scan output, thus preserving the flip-flop data at the data output.

11. A scannable flip-flop circuit comprising:

three latch circuits, a master latch, a slave latch, and a scan latch, each having a first input and a second input and one output, the inputs of the master latch being two inputs of the flip-flop circuit, the output of the slave latch being an output of the flop-flop circuit, and the output of the scan latch being another output of the flip-flop circuit, said latch circuits being arranged such that the output of the master latch is coupled to one input of each of the slave and scan latches, the output of the slave latch is coupled to the other input of the scan latch, and the output of the scan latch is coupled to the other input of the slave latch;

control and clock functions for selectively controlling the coupling of the latch circuits;

such that, in a first mode of operation, wherein a first control signal and a second control signal are enabled, a system clock signal is enabled and a first and second scan clock signals are disabled, data at the first input of the master latch is transferred to and latched into the slave latch and the scan latch by the system clock;

further such that, in a second mode of operation, wherein the first control signal is enabled, the second control signal is disabled, the system clock signal is enabled, and both scan clock signals are disabled, data at the first input of the master latch is transferred to and latched into only the slave latch by the system clock;

further such that, in a third mode of operation, wherein the first control signal is disabled, the second control signal is enabled, the system clock signal is disabled, and both scan clock signals are enabled, data at the second flip-flop input is transferred to and latched into the scan latch and the slave latch by a pulse of the first scan clock signal followed by a pulse of the second scan clock signal; and further such that, in a fourth mode of operation, wherein the first and second control signals are disabled, the system clock signal is disabled, and both scan clock signals are enabled, data at the second flip-flop input is transferred to and latched into only the scan latch by a pulse of the first scan clock signal followed by a pulse of the second scan clock signal.

12. A scannable flip-flop circuit as defined in claim 11 wherein the three latch circuits each comprise two inverter gates, the output of the first inverter gate being coupled to the input of the second inverter gate, the output of the second inverter gate being coupled to the input of the first inverter gate, the output of the latch circuit being the output of the first inverter gate, the first input of the latch circuit being the input of the first inverter gate, and the second input of the latch circuit being coupled to the output of the second inverter gate.

13. A scannable flip-flop circuit as defined in claim 12 wherein the coupling between inverter gates is implemented with direct connections.

14. A scannable flip-flop circuit as defined in claim 13 wherein the first inverter gate has greater drive capability than the second inverter gate, thereby eliminating contention at the input to the first inverter gate between the first input to the latch circuit and the output of the second inverter gate.

15. A scannable flip-flop circuit as defined in claim 12 wherein said coupling of signals is implemented with pass transistors, said pass transistors being operable in either an enabled state, wherein the signal may pass across the pass transistor, or in a disabled state, wherein the signal is blocked by the pass transistor, said status of the pass transistors being selectively controllable via the control and clock signals.

16. A scannable flip-flop circuit as defined in claim 12 wherein said coupling between inverter gates is selectively controllable via the control and clock functions.

17. A scannable flip-flop circuit as defined in claim 16 wherein the control and clock functions disable the coupling within each latch circuit between the output of the second inverter gate and the input of the first inverter gate while the input to the latch circuit is active, thereby eliminating contention at the input of the first inverter gate between the input to the latch circuit and the output of the second inverter gate.

18. A scannable flip-flop circuit as defined in claim 17 wherein the coupling of signals is implemented with transmission gates, said transmission gates being operable in either an enabled state, wherein the signal may pass across the transmission gate, or in a disabled state, wherein the signal is blocked by the transmission gate, said states of the transmission gates being selectively controllable via the control and clock signals.

19. In a scannable flip-flop circuit comprising a slave latch and a scan latch, both of which receive and latch values from a master latch, a method comprising storing a value in the slave latch through the master latch and shifting the contents of the master latch and the contents of the slave latch out of the flip-flop circuit via the scan latch without affecting the contents of the slave latch.

* * * * *